United States Patent [19]

Patrick et al.

[11] 4,040,895
[45] Aug. 9, 1977

[54] CONTROL OF OXYGEN IN SILICON CRYSTALS

[75] Inventors: William John Patrick, Poughkeepsie; Wolfgang Alfred Westdorp, Hopewell Junction, both of N.Y.

[73] Assignee: International Business Machines Corporation, Armonk, N.Y.

[21] Appl. No.: 624,618

[22] Filed: Oct. 22, 1975

[51] Int. Cl.$^2$ .................. B01J 17/18; C01B 33/02
[52] U.S. Cl. .................. 156/618; 23/273 SP; 423/324
[58] Field of Search .......... 156/618, 617 SP; 23/273 SP

[56] References Cited

U.S. PATENT DOCUMENTS

| | | | |
|---|---|---|---|
| 3,353,914 | 11/1967 | Pickar | 23/273 SP |
| 3,490,877 | 1/1970 | Bollen | 23/273 SP |
| 3,873,463 | 3/1975 | Tolksdorf | 23/273 SP |
| 3,929,557 | 12/1975 | Goodrum | 23/273 SP |

OTHER PUBLICATIONS

IBM Tech. Discl. Bull., vol 14, No. 5, Oct. 1971, p. 1631.
IBM Tech. Discl. Bull., vol. 13, No. 6, Nov. 1970, p. 1571.
Scheel, Journal of Crystal Growth, vol. 13/14, 1972, pp. 560–565.
IBM Tech. Discl. Bull., Mueller-Krumbhaar et al., vol. 17, No. 3, Aug. '74, pp. 903–904.

*Primary Examiner*—Stephen J. Emery
*Attorney, Agent, or Firm*—David M. Bunnell

[57] ABSTRACT

The seed to tail oxygen concentration gradient in silicon crystals, which are drawn from a silicon melt contained in a silica vessel according to the Czochralski process, is controlled by a process employing stop-go crucible rotation to provide fluid shearing at the melt-crucible interface.

4 Claims, 1 Drawing Figure

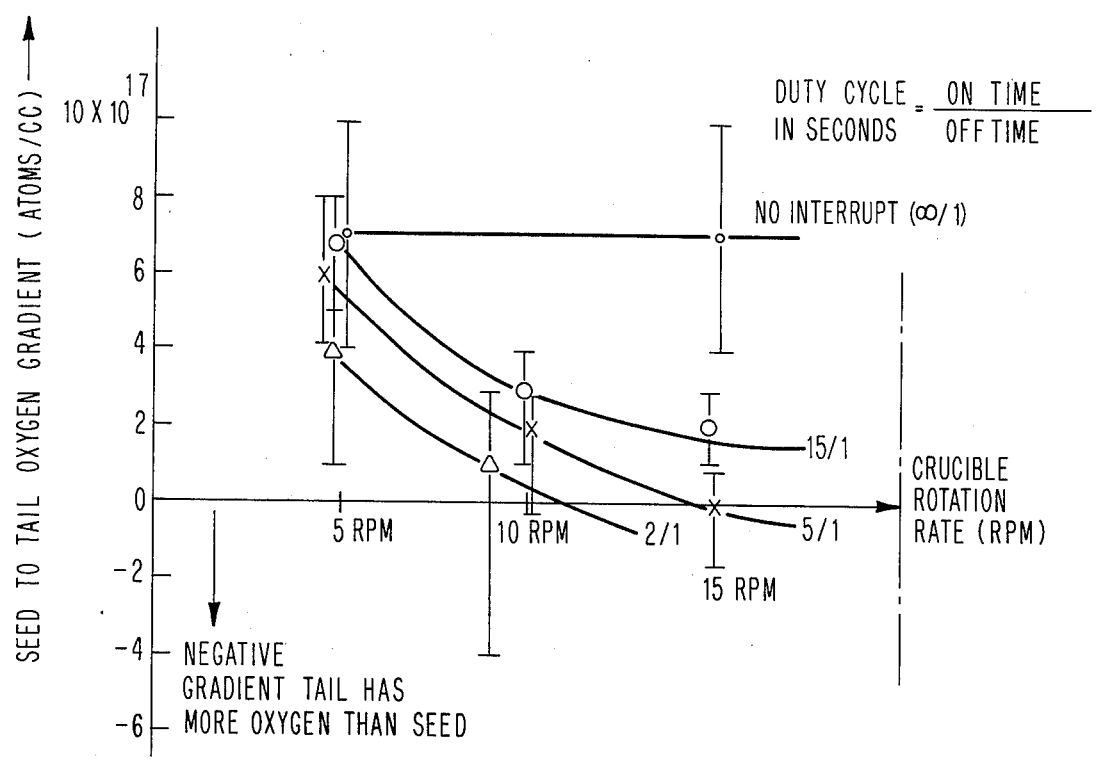

CONTROL OF OXYGEN IN SILICON CRYSTALS

The purpose of this abstract is to enable the public and the Patent Office to rapidly determine the subject matter of the technical disclosure of the application. This abstract is neither intended to define the invention of the application nor is it intended to be limiting as to the scope thereof.

BACKGROUND OF THE INVENTION

This invention relates generally to a crystal growing method and more particularly to a crystal growing method for growing single crystals of material such as silicon in which the oxygen concentration gradient in the crystals is controlled.

The production of single crystals from materials such as silicon plays an important role in semiconductor technologies. A suitable method for growing the crystals is known as the Czochralski technique in which a seed crystal, which has the desired crystal orientation, is introduced into a melt of the semiconductor material. The melt can also contain certain dopants which are introduced fo the purpose of modifying the electrical characteristics of the semiconductor material as is known in the art. The melt is contained in a silica crucible or vessel which is heated so that the semiconductor melt is at, or slightly above, its melting point. The seed crystal is slowly withdrawn from the melt, in an inert atmosphere such as argon, and the semiconductor material solidifies on the seed to produce the growth of a single crystal. A cylindrical crystal is produced by rotating the crystal as it is drawn. The crucible is conventionally rotated in the opposite direction for the purposes of mixing the melt under the growing crystal. The withdrawing rate and power to the heating means is greater at first in order to cause a neck down of the crystal. This reduces dislocations caused by the thermal shock which occurs when the seed crystal initially contacts the melt. The withdrawing rate is then decreased and the power is reduced in order to cause the diameter of the crystal to increase in a cone shaped manner until the desired crystal diameter is reached. The withdrawal rate and heating are then maintained constant until close to the end of the process where again the rate and heating are increased so that the diameter decreases to form a cone and neck portion at the end.

At the melt temperature of silicon (about 1,400° C), the surface of the silica crucible which is in contact with the melt dissolves and forms silicon monoxide, SiO, which enters the melt and evaporates from the surface of the melt. The SiO is a source of oxygen which enters the melt and, consequently the drawn crystal. Heretofore, the presence of oxygen in the crystal has been generally regarded as an undesirable impurity. It is also found that the oxygen concentration in the crystal is not constant but varies from the seed end, where it is at the highest level, to the tail end of the crystal where it is at its lowest level. Initially, the oxygen content of the melt is in the order of $3 \times 10^{18}$ atoms per cubic centimeters which is about the saturation point. The oxygen in the grown crystal ranges from about $1.5 \times 10^{18}$ atoms/cc in the seed down to around $6 \times 10^{17}$ atoms/cc at the tail. From this, it is apparent that the oxygen content of the melt is depleted during the crystal growing process, probably due to a lower dissolution rate of the crucible as the process continues.

It has recently been found that the presence of oxygen can have beneficial effects on the properties of semiconductor devices manufactured from the grown crystals. For example, a reduction in leakage currents is noted at higher oxygen levels. Accordingly, it has been found that the observed beneficial effect on leakage occurs primarily with devices made from semiconductor wafers cut from the seed end of the crystal which has the higher oxygen contents. Therefore, it is desirable to be able to reduce the oxygen concentration gradient through the length of the crystal so that the same beneficial effects on the yield of devices will be obtained whether the semiconductor wafers used in making the devices are cut from the seed or the tail end of the crystal. A process to both increase the oxygen level in the crystals and to control the seed to tail oxygen concentration gradient is the subject of copending application Ser. No. 581,307, filed 5/27/75, entitled "Process for Controlling the Oxygen Content of Silicon Crystals", which involves the treatment of the crucible surface.

We have found another method for controlling the oxygen content. The method can either be used by itself or in combination with the method of Ser. No. 581,307.

SUMMARY OF THE INVENTION

In accordance with this invention, a process is provided for controlling the oxygen concentration gradient in a silicon crystal, which is drawn from a melt of silicon contained in a silica vessel, comprising: continuously rotating the crystal as it is drawn from the melt, while rotating the crucible in a direction opposite to the direction of crystal rotation, and controlling the oxygen concentration of the melt during the crystal growing process by periodically stopping the rotation of the crucible to create fluid shearing at the melt-crucible interface.

DESCRIPTION OF THE DRAWING

The drawing is a graph illustrating the effects of different crucible rotation on/off duty cycles on the seed-to-tail oxygen concentration gradient in the silicon crystal.

DETAILED DESCRIPTION

The foregoing and other objects, features and advantages of the invention will be apparent from the following more particular description of the preferred embodiments of the invention.

As described above, a commonly used method for the growth of single crystals of semiconductor material such as silicon is the well known Czochralski method in which a charge of very pure silicon, from which the single crystal is to be grown, is placed in a crucible. The surface of the cruible which is in contact with the semiconductor melt is highly pure silica. Such crucibles of highly pure silica are commercially available. Alternatively, silica lined vessels such as a silica lined graphite crucible can be employed. If a doping impurity is to be added to the crystal, it is added to the charge of silicon. The crucible containing the charge is placed in a controlled inert atmosphere, such as argon. Carbon resistance heaters or RF induction coils which encircle the crucible, introduce heat and cause the charge temperature to be stabilized to just above the melting point of the semiconductor material. A seed crystal, which is a small highly perfect and oriented crystal of the semiconductor material is attached to the end of a pulling rod. An example of a typical seed crystal is a square rod of silicon of about 1/4 inch in diameter and about 3 inches long. The pulling rod is actuated by a conventional crystal pulling mechanism which controls its upward movement at a selected uniform rate such as from about 1/4 to 4 inches per hour. The seed crystal is lowered into the molten semiconductor and is permitted to partially melt in order to remove any surface imperfections. The seed is then slowly withdrawn from the melt and rotated at a rate of, for example, 5–25 rpm while it is being withdrawn so that a cylindrical crystal is produced. The drawing rate and heating of the charge is made higher initially in order to minimize the dislocation effects which occur when the seed is first introduced into the molten semiconductor material. After this so called necked down portion is formed, the drawing rate and power to the heating coils are lowered until the desired crystal diameter of from about 1 to 5 inches, is obtained. This diameter is then maintained until close to the end of the crystal drawing process. Typically a 12 to 16 inch long crystal is produced.

The crystal is sawed into thin slices, commonly referred to as wafers which, after thinning and polishing, are subjected to a conventional series of epitaxy, masking diffusion, and metallization steps required to produce desired micro electronic components or integrated circuits.

The crystal is of a high purity silicon containing any dopants which are introduced for the purpose of modifying the properties of the semiconductor material. It has been found the crystals contain oxygen as an impurity in amounts of from about $1.5 \times 10^{18}$ at the end down to about $6 \times 10^{17}$ atoms/cc at the tail end. The oxygen results from the contact of the hot melt with the silica surface of the crucible which forms silicon monoxide and introduces oxygen into the melt. It is believed that initially the oxygen content in the melt is about at saturation or about $3 \times 10^{18}$ atoms/cc of oxygen. The concenration of oxygen apparently decreases during the crystal pulling process due to a lower dissolution rate of the crucible surface. This lower effective dissolution rate is attributed to the passivating effect of silicon monoxide layers which form on the crucible walls and protect it to some extent from further attack by the molten silicon. It is desirable that the seed-to-tail oxygen contentration gradient be kept to about $4 \times 10^{17}$ atoms/cc or less, so that it is not necessary to select wafers on the basis of from which end of the crystal they are cut.

According to the process of the invention, a shearing action is periodically created at the melt-crucible interface which results in a smaller oxygen concentration gradient in the crystal. This result is belived to be caused by a reduction in the passivating effect of SiO platelet formation on the crucible surface which leads to a more uniform oxygen content in the melt throughout the crystal growing process. The shearing action is created by rotating the crucible in a direction opposite to crystal rotation and then stopping the rotation and allowing the crucible to remain stationary for a short period of time during which the melt continues to rotate. The crucible rotation is then started again prior to the time that any appreciable slowing of the melt rotation occurs. Appreciable slowing of the melt rotation may cause the crystal growing process conditions at the crystal-melt interface to be adversely affected by a rise in temperature.

The on/off crucible rotation cycles are continued during the crystal growth process. The length of the duty cycle on on time/off time and the rate of rotation can be used to tailor the oxygen concentration gradient. The optimum conditions will vary depending upon the apparatus, the crystal dimension, the size of the charge, and process conditions. Generally, the preferred on times and off times will each range from about 1 to 15 seconds; and the rate of crucible rotation will range from about 5 to 20 rpm. Times shorter than about 1 secondmay create shock waves and turbulence or mixing in the melt which can adversely affect crystal quality. Times longer than about 15 seconds either may cause a temperature spike at the crystal interface, in the case of off time, or produce insufficient shear to avoid crucible surface passivation, in the case of on time. The optimum conditions are those which, as nearly as possible, retain the normal crystal growth which would be obtained with continuous crucible rotation, while providing sufficient shear at the melt-crucible interface to produce the desired oxygen concentration gradient reduction. The starting and stopping is abrupt, by turning the power to the motor used to rotate the crucible on and off. A more gradual breaking action could be used to reduce turbulence but has been found to be needed.

The results which can be obtained by the process of the invention are further illustrated by the following examples.

EXAMPLE 1

Identical charges of 3.5 kilograms of high purity silicon were placed in high purity cylindrical silica crucibles (6 inches in diameter and 5 inches deep) and the charges heated to a temperature of about 1450° C to melt the charges. Silicon seed crystal rods approximately 3 inches long and 1/4 inch square having a 1, 0, 0 crystal lattice orientation were introduced into the melts and the crystals were slowly withdrawn from the melt to give first a reduction in diameter to about 1/16 of an inch after which a cone shaped portion was drawn with rotation of the drawing rod at an rpm of 10 until crystals of about 2 1/4 inches in diameter were obtained. This diameter was maintained constant to near the end of the growth where a second cone shaped portion was produced to complete the crystals. The crystals had a length of about 12 inches. As shown in the graph in the drawing, control crucibles were rotated at constant speed (duty cycle; = on time/off time, $\infty/1$ means constant rotation).

Other runs were made with duty cycles of 15/1 = on/off; 5/1 = on/off and 2/1 = on/off, where the units of time are in seconds, at the stated crucible rpms of 5 to 15. The on/off cycling can be started at any point in the process, the preferred point being approximately 3 inches from the shoulder. The vertical lines in the graph represent error bars, or the range in oxygen gradient data. Oxygen measurements were obtained by infrared absorption spectroscopy performed on slices taken from the crystal. The improvement in the seed-to-tail oxygen concentration gradient which is achieved by the on-off rotation compared with the constantly rotated control is readily apparent from the graph.

EXAMPLE 2

Silicon crystals having a length of 13 inches and a diameter of 3 1/4 inches, with a seed-to-tail oxygen concentration gradient of less than $4 \times 10^{17}$ atoms/cc, were drawn from a 7 Kg charge of molten silicon, contained in a high purity cylindrical silica crucible (8 inches ×8 inches). The concentration in the seed end was about $17 \times 10^{17}$ atoms/cc and at the tail end $14 \times 10^{17}$ atoms/cc. A silicon seed crystal rod 3 inches long and 1/4 inch square having a 1, 0, 0 crystal lattice was used. The crystal was rotated at about 22 rpm during the pulling process and the crucible was alternately rotated at 10 rpm and stopped for duty cycles of 5 seconds on and 5 seconds off (5/5). Satisfactory on/off duty cycles under the example conditions were found to range from about 4/6 to 6/4 or 5/5 within ±50. Control crystals which were pulled at a constant crucible rotation of 10 rpm, using the same apparatus and conditions with continuous crucible rotation, gave oxygen contents ranging from 17 to $9 \times 10^{17}$ atoms/cc or a seed-to-tail oxygen concentration gradient of about $8 \times 10^{17}$ atoms/cc.

The foregoing process provides a more uniform oxygen concentration in silicon crystals. The oxygen concentrations range from about $13 \times 10^{17}$ to $17 \times 10^{17}$ atoms/cc. Semiconductor devices, made from wafers cut from crystals grown according to the process of the invention, had improved electrical properties when compared with devices made from wafers from control crystals, which were grown with constant speed crucible rotation. This improvement was noted regardless of from where the wafers were cut from the crystal. The crucibles used in the examples were untreated but crucibles treated in accordance with the process of application Ser. No. 581,307 could be used to obtain the combined benefit of each process.

While the invention has been particularly shown and described with reference to preferred embodiments thereof, it will be understood by those skilled in the art that the foregoing and other changes in form and details may be made therein without departing from the spirit and scope of the invention.

We claim:

1. A process for controlling the oxygen content gradient in a silicon crystal, which is drawn from a melt of silicon contained in a silica crucible, comprising:

continuously rotating the crystal as it is drawn from the melt, while rotating the crucible in a direction opposite to the direction of crystal rotation with the rate of crucible rotation ranging from about 5 to 20 rpm; and controlling the oxygen concentration of the melt during the crystal growing process by periodically stopping the rotation of the crucible, to create fluid shearing at the melt-crucible interface, in regular on time/off time duty cycles in which the on time and the off time each range from about 1 to 15 seconds with the duty cycles and the rate of crucible rotation being selected such that adverse effects on crystal quality do not occur while the oxygen concentration gradient in the silicon crystal is kept to about $4 \times 10^{17}$ atoms/cc or less.

2. The process of claim 1 wherein the on time/off time duty cycles range from 15 seconds/1 second to 2 seconds/1 second.

3. The process of claim 1 wherein the on time/off duty cycle is 5 seconds/5 seconds within ± 50%.

4. A silicon crystal grown according to the process of claim 1.

* * * * *